(12) United States Patent
Wallmeroth et al.

(10) Patent No.: US 9,995,541 B2
(45) Date of Patent: Jun. 12, 2018

(54) METHOD FOR FORMING A COMPOSITE MATERIAL, AND HEAT SINK

(75) Inventors: Klaus Wallmeroth, Zimmern o.R. (DE); Christian Schmitz, Dunningen (DE)

(73) Assignee: TRUMPF LASER GMBH, Schramberg (DE)

( * ) Notice: Subject to any disclaimer, the term of this patent is extended or adjusted under 35 U.S.C. 154(b) by 1184 days.

(21) Appl. No.: 14/233,488

(22) PCT Filed: Jul. 11, 2012

(86) PCT No.: PCT/EP2012/063560
§ 371 (c)(1),
(2), (4) Date: Jan. 17, 2014

(87) PCT Pub. No.: WO2013/010870
PCT Pub. Date: Jan. 24, 2013

(65) Prior Publication Data
US 2014/0151013 A1 Jun. 5, 2014

(30) Foreign Application Priority Data
Jul. 20, 2011 (DE) .................. 10 2011 079 471

(51) Int. Cl.
*F28F 21/02* (2006.01)
*H01L 23/373* (2006.01)
(Continued)

(52) U.S. Cl.
CPC .............. *F28F 21/02* (2013.01); *B22F 7/02* (2013.01); *F28F 21/08* (2013.01); *H01L 23/373* (2013.01);
(Continued)

(58) Field of Classification Search
CPC .. F28F 21/02; F28F 21/08; B22F 7/02; C23C 24/08; C23C 24/082; C23C 24/085; C23C 24/10; C23C 24/103
(Continued)

(56) References Cited

U.S. PATENT DOCUMENTS 4,944,817 A * 7/1990 Bourell .................. B22F 3/004
156/272.8
5,182,170 A 1/1993 Marcus et al.
(Continued)

FOREIGN PATENT DOCUMENTS

AT        11107 U1      4/2010
CN       101797824 A    8/2010
(Continued)

OTHER PUBLICATIONS

"Pressure Loss and Heat Transfer through Heat Sinks Produced by Selective Laser Melting"—Wong et al. pp. 1069, Paragraph 3—p. 1070 Paragraph 2.*
(Continued)

*Primary Examiner* — Jason L Vaughan
*Assistant Examiner* — Amanda Meneghini
(74) *Attorney, Agent, or Firm* — Fish & Richardson P.C.

(57) ABSTRACT

A method for forming a carbon-metal composite material for a heat sink, comprising the following steps: applying at least one layer comprising carbon particles and at least one layer comprising metal particles on top of one another; and fusing of the layers by irradiating the layers with laser radiation to form the carbon-metal composite material. The invention also relates to a heat sink having a shaped body that comprises a plurality of layers, each layer containing carbon particles in a metal matrix.

8 Claims, 2 Drawing Sheets

(51) Int. Cl.
    *B22F 7/02*     (2006.01)
    *F28F 21/08*     (2006.01)
    *H01S 5/024*     (2006.01)

(52) U.S. Cl.
    CPC ...... *H01L 23/3732* (2013.01); *H01L 23/3733* (2013.01); *H01L 23/3735* (2013.01); *H01L 2924/0002* (2013.01); *H01S 5/02484* (2013.01)

(58) Field of Classification Search
    USPC ........ 165/185; 29/890.03, 890.035, 890.054; 427/554, 555, 556, 596, 597; 219/121.6, 219/121.64, 121.66, 121.85
    See application file for complete search history.

(56) References Cited

U.S. PATENT DOCUMENTS

| | | | | |
|---|---|---|---|---|
| 5,224,017 | A * | 6/1993 | Martin | ............... H01L 23/3733 165/185 |
| 5,273,790 | A | 12/1993 | Herb et al. | |
| 6,171,691 | B1 | 1/2001 | Nishibayashi | |
| 2007/0071907 | A1* | 3/2007 | Stiles | ................ B23K 26/1476 427/554 |
| 2008/0085403 | A1* | 4/2008 | Sayir | ....................... C09K 5/14 428/212 |
| 2008/0128067 | A1 | 6/2008 | Sayir et al. | |
| 2010/0175853 | A1 | 7/2010 | Ebert et al. | |

FOREIGN PATENT DOCUMENTS

| | | |
|---|---|---|
| CN | 101889342 A | 11/2010 |
| CN | 101985702 A | 3/2011 |
| DE | 19827665 A1 | 12/1999 |
| DE | 102006056988 A1 | 10/2008 |
| DE | 102007051570 A1 | 4/2009 |
| DE | 102009018762 A1 | 11/2010 |
| EP | 0859408 A2 | 8/1998 |
| JP | 09312362 A | 12/1997 |
| JP | 2011503872 A | 1/2001 |
| JP | 2002097532 A | 4/2002 |
| JP | 2006001232 A | 1/2006 |
| JP | 2008095171 A | 4/2008 |
| WO | 0145882 A2 | 6/2001 |
| WO | 2010057236 A2 | 5/2010 |

OTHER PUBLICATIONS

English translation of International Preliminary Report on Patentability dated Jan. 21, 2014.
Wong M et al: "Pressure loss and heat transfer through heat sinks produced by selective laser melting" Heat Transfer Engineering, Hemisphere Pub, Washington, DC, US, Bd. 30, Nr. 13, Nov. 1, 2009 (Nov. 1, 2009), Seiten 1068-1076, XP008150615, ISSN: 0145-7632, DOI: 10.1080/01457630902922228.
S. Vaucher et al: "Selective Laser Sintering of Aluminium-Silicon Carbide Metal Matrix Composites.", Materials Week 2002, ICM Munich, Oct. 2, 2002 (Oct. 2, 2002), Seiten 1-8, XP055024712, ISBN: 978-3-88-355314-6.
International Search Report and Written Opinion dated Dec. 17, 2012.
German Office Action dated Mar. 19, 2012.

* cited by examiner

METHOD FOR FORMING A COMPOSITE MATERIAL, AND HEAT SINK

This application is a national stage application of International Application No. PCT/EP2012/063560 (WO 2013/010870 A1), filed Jul. 11, 2012 which is herein incorporated by reference in its entirety.

BACKGROUND

1. Field of the Invention

The present invention relates to a method for forming a carbon-metal composite material for a heat sink, and a heat sink which has at least one shaped body.

2. Background

WO 2010/057236 describes a heat sink and a method of producing the heat sink. The heat sink has a base body comprising an insertion body that consists of a carbon-metal composite material and that is spaced away from a positioning surface for positioning a component to be cooled, e.g. a laser diode. Silver-diamond, copper-diamond and aluminium-diamond, in particular, are specified as carbon-metal composite materials.

The insertion body can be produced by filling a receptacle with a carbon phase and a metallic phase, the metallic phase in the (molten) liquid state entering the receptacle in order to infiltrate the carbon phase. Both unpressurised processes and processes with pressure support, e.g. a GPI process (Gas Pressure Infiltration Process), can be used for the purposes of infiltration. Irrespective hereof, hot pressing of the insertion body is alternatively described as a further production method.

Owing to the low quality of the upper surface of the insertion body produced in the way described above and the fact that post-processing of the insertion body, for example by polishing, is possible only at considerable expense, it is suggested that the insertion body, after it has been received in the base body, be applied at a distance from the positioning surface for application of the component and covered, for example, with a solder layer.

U.S. Pat. No. 5,273,790 discloses a method for consolidating synthetic diamonds or diamond composite materials that can be used, inter alia, for cooling electronic components. For this purpose, particles of diamond or other materials are infiltrated with diamond material having a high thermal conductivity using a CVD method. A volume of the consolidated diamond material or diamond composite material can be structured in layers by infiltrating a respective layer or preform of diamond or other materials with diamond material using a CVD method.

US 2007/0071907 describes an article or body which has an iron-containing substrate and a wear-resistant layer that consists of a composite material. The composite material has diamond particles in a metal matrix. In order to form the composite material, a particle mixture of diamond particles and metal particles is applied to the iron-containing substrate and the mixture is heated in a non-reactive atmosphere using a laser beam in order to fuse the metal particles so that they bond with the substrate and with the diamond particles to the wear-resistant layer. In order to prevent the diamond particles being damaged by the laser radiation, a material having a melting point of between 400 and 900° C., in particular silver or copper, is recommended as the metallic matrix material.

SUMMARY

The object of the present invention is to provide a method for forming a carbon-metal composite material for a heat sink, and a heat sink, in which a composite material having improved properties can be produced and the effort of forming the composite material can be reduced.

This object is achieved according to the invention by a method for forming a carbon-metal composite material for a heat sink, in which at least one layer comprising carbon particles and at least one layer comprising metal particles are applied on top of one another, wherein the layers are fused by irradiating the layers with laser radiation to form (a layer of) the carbon-metal composite material. The metal particles and the carbon particles are typically applied here in the form of a powder.

Through the laser radiation, a fusion zone is formed in which the layer(s) with the metal particles is/are fused so that the metal particles in molten liquid form can penetrate the layer(s) of carbon particles and infiltrate them and the carbon particles are enclosed in a metallic matrix. The layers are typically fused in a non-reactive environment, e.g. in an inert gas environment or under vacuum.

In one variant, in order to form a shaped body from the carbon-metal composite material, the applying and the fusing of layers is repeated a number of times. By the method according to the invention, a shaped body can be structured in layers, wherein the geometry, in particular the length and width of the layers of the carbon-metal composite material, can be varied in order to give the shaped body a desired geometry or to adjust the geometry of the shaped body to the desired end contour. The shaped body of the composite material formed in this way has a layer structure, it being possible for the properties of the composite material, for example the ratio of carbon to metal, to be adjusted flexibly in a respective layer by applying a number of layers on top of one another.

In a further variant, a final layer of the shaped body is post-processed. The final layer, i.e. the last layer of the shaped body structured in layers, can serve for application of a component, e.g. a laser diode, a laser disc or the like. In order to be able to position this component with the desired accuracy and ensure high thermal conductivity, it is advantageous, on the upper surface of the final layer, to carry out post-processing or finishing with a high level of precision in order to achieve a low surface roughness.

The production of the shaped body in layers according to the invention makes it possible to obtain a defined final layer that can easily be post-processed or polished. In particular, for the last layer(s), only metal particles can be provided in order to facilitate post-processing. In this variant, in order to form a final layer for the shaped body, a layer comprising metal particles is applied and fused by irradiation with laser radiation so that a metal layer is produced that bonds with a layer of the carbon-metal composite material lying underneath it. The material of the metal particles usually corresponds to the metallic material that is also used to form the carbon-metal composite material so that the final layer and the layers of carbon-metal composite material can be produced in one and the same production process. The final layer has, in this case, (virtually) no carbon particles and can therefore easily be post-processed. The final layer can also be formed of a number of individual layers.

It is also (alternatively) possible for a layer of the carbon-metal composite material, for the production of which a comparatively thick layer comprising metal particles is used, to serve as a final layer so that, after fusing with the layer of carbon particles, there are as far as possible no or only very few carbon particles in the upper area of the final layer.

The layers of metal and carbon particles can be applied before the application of laser radiation. However, in particular with respect to the application of the metal particles, it is also possible for particles to be supplied during the application of laser radiation, for example coaxially to the laser beam.

In one variant, at least two of the layers have carbon particles with different granulation (mean particle size). A small granulation may possibly be advantageous in layers that are located close to the final layer. A larger granulation may, for example, be advantageous in layers located further away from the final layer.

In one variant, at least two layers of the carbon-metal composite material are produced having a different volume ratio of carbon particles to a metal matrix formed from metal particles. As a result of the separate application of the carbon particles and metal particles, the material composition of the shaped body may vary from layer to layer. The desired ratio can, for example, be obtained by setting the ratio of the thickness of the layer of metal particles to the thickness of the layer of carbon particles appropriately. It is self-evident that the thickness of the layer of carbon-metal composite material respectively formed during fusing can also be varied within certain limits by choosing the thickness of the particle layers.

In addition to the variation of the layer composition through the particle sizes and particle volumes used, the properties of the shaped body can also be influenced via the defined structure of the shaped body comprising different layers. For example, the layers of the shaped body first applied to the substrate may be layers of metal particles and a metal-carbon composite may only be introduced in the following layers. In other words, the composition of the individual layers and the structure of the shaped body comprising these layers are freely selectable.

In a refinement, the metal particles are selected from the group comprising: copper, silver, gold, aluminium, tin and titanium. In particular, silver and copper in a composition with diamond have proven to be advantageous as a composite material owing to their very high thermal conductivity. If such a composite material is used as a heat sink for a component comprising gallium arsenide (e.g. a high-performance laser diode), the thermal expansion or the thermal expansion coefficient of the heat sink is adjusted to the thermal expansion of the component. The difference between the thermal expansion coefficient of the component and that of the composite material in such an adjustment is typically less than $2 \times 10^{-6}$ 1/K.

In a further variant, the carbon particles are selected from the group comprising: diamond, graphite and carbide. In particular, diamond has proven to be especially advantageous for the production of a composite material owing to its high thermal conductivity. Within the meaning of this application, carbon particles are also understood to refer to compounds containing carbon, in particular carbide.

One variant comprises applying at least one layer of metal particles to a substrate and fusing the layer to the substrate through laser radiation. In this variation, one or more metallic layers are applied to a substrate and fused to it before layers comprising metal particles and comprising carbon particles are alternately fused with one another. In this way, the adhesion of the composite material to the substrate can be increased and a smooth surface can be achieved for the application of the composite material.

In a further variant, at least one layer comprising carbon particles is applied with a density varying in a thickness direction. The layers are typically applied such that the particles have, as far as possible, a constant thickness in the thickness direction. However, in order to produce a gradient layer, it may be advantageous if the density or the number of carbon particles in the thickness direction varies, the latter typically increasing or decreasing with the increasing thickness of the layer.

A further aspect of the invention is realised in a heat sink for a component, comprising a shaped body of a carbon-metal composite material, which comprises a plurality of layers, each layer containing carbon particles in a metal matrix surrounding the carbon particles. The carbon-metal composite material can be produced here, in particular, in the way described above. The heat sink may, if applicable, consist only of the shaped body (applied to a substrate) which, if applicable, is post-processed to produce the desired end contour(s). Alternatively, it is also possible to form the shaped body within a receptacle of a base body of a heat sink or to bond the shaped body to the base body of the heat sink, for example through soldering.

In one embodiment, the heat sink has a component to be cooled, for example a (high-performance) laser diode or a laser disc, which is arranged on a positioning surface formed on the shaped body. In particular, carbon-metal composite materials of copper and diamond or of silver and diamond have shown themselves to be particularly advantageous for cooling laser diodes or laser discs. A laser disc is a plate-shaped solid state medium which contains a laser-active material or consists thereof. The laser-active medium typically has a host crystal (YAG, YVO4, etc.) that has been provided with an active material (Yb3, Nd3+, Ho, Tm3, etc.). The laser-active medium may, for example, be Yb:YAG, Nd:YAG or Nd:YVO4. The plate-shaped laser disc usually has a circular geometry, but this is not absolutely necessary, i.e. the laser disc may also have, for example, a square or rectangular geometry.

The component to be cooled may be applied to the positioning surface or bonded to the shaped body in various ways, for example using a joining agent, e.g. though a solder connection (using at least one solder layer) or through an adhesive connection (by means of at least one adhesive layer). It is self-evident that a good thermal coupling between the component and the shaped body should be ensured irrespective of the connection method chosen. An adhesive layer used for this purpose may be formed, for example, as in EP 1 178 579 A2, which is included in this application by reference.

In a further embodiment, the component to be cooled is arranged directly on the positioning surface, i.e. without the use of additional intermediate layers, e.g. in the form of solder layers or adhesive layers. In this case, the shaped body typically has a positioning surface with a low upper surface roughness. This low upper surface roughness can, for example, be achieved by post-processing of the positioning surface. The positioning surface may be formed here on a final layer of the shaped body, which final layer consists of the carbon-metal composite material, so that the component to be cooled by means of the heat sink can be applied directly onto the positioning surface of the carbon-metal composite material. Alternatively, a layer formed from metal particles can be applied to a layer of the carbon-metal composite material as a final layer, the material of the metal particles of the final layer typically corresponding to the material of the metal particles of the composite material. A positioning surface having a low surface roughness has also shown itself to be advantageous when using an intermediate layer, e.g. an adhesive layer or a solder layer.

In a further embodiment, the heat sink comprises a base body for application of the shaped body. The shaped body may be bonded to the base body, for example through soldering, or a receptacle may be provided in order to receive the shaped body. In the latter case, the layers can be applied directly in the receptacle and fused with one another there under the effect of laser radiation. The final layer or the cover layer of the shaped body may essentially end here flush with the upper edge of the base body and serve as a positioning surface for the component to be cooled after corresponding post-processing.

Further advantages of the invention are disclosed in the description and the drawings. The features specified above and those yet to be described below can each be used per se or in a number of desired combinations. The embodiments shown and described are not to be understood as an exhaustive list, but are instead examples to describe the invention.

DETAILED DESCRIPTION

FIGS. 1a-d show a chamber 1 for forming a layer of a carbon-metal composite material, in the present example in the form of a diamond-copper composite material. In order to create a non-reactive environment in the chamber 1, the chamber 1 has a connection 2 for feeding in an inert gas, e.g. nitrogen. However, the chamber 1 may also be connected to a vacuum pump in order to create a non-reactive environment inside the chamber 1.

A substrate 3, for example of copper, is arranged in the chamber 1. A device 4 for distributing particles is arranged above the substrate 3 and is connected to two particle reservoirs (not shown) via a central feed line. The device 4 has a number of evenly spaced openings (not represented graphically) from which particles can emerge as indicated by arrows.

Figure 1A:
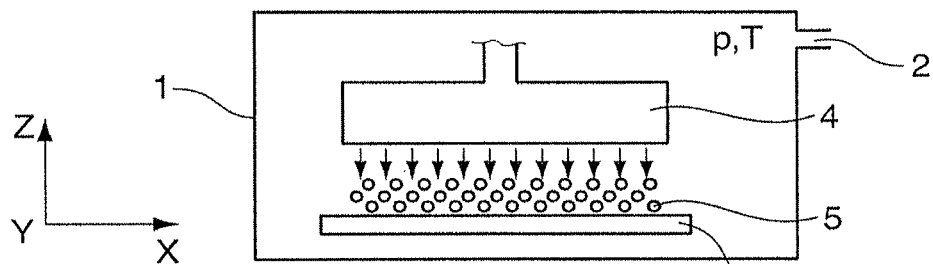
FIGS. 1a-d show schematic representations of a method for forming a layer of diamond-metal composite material, FIGS. 2a,b show cross-sectional representations of a detail of a heat sink having a shaped body consisting of a diamond-metal composite material without and with a component to be cooled.
Figure 1B:
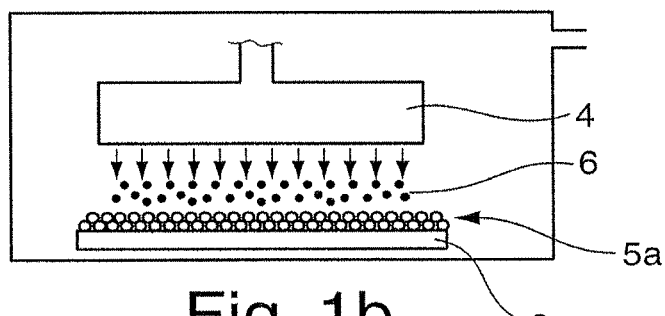
Figure 1C:
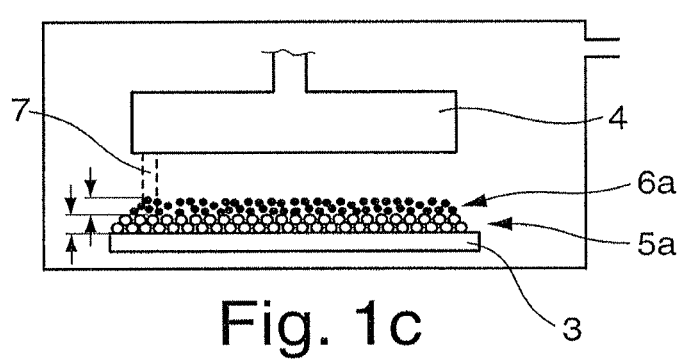

In the example shown in FIG. 1a, (pulverulent) diamond particles 5 emerge from the device 4, sink onto the substrate 3 under the effect of gravity and form a layer 5a of diamond particles 5 there as shown in FIG. 1b. In order to obtain the most homogeneous distribution of diamond particles 5 possible in the layer 5a, the device 4 may, for example, be displaced parallel to the substrate 3 (i.e. in the XY plane) during the application, for example in the manner of a vibrating sieve.

In a subsequent step shown in FIG. 1b, copper particles 6 are applied to the layer 5a comprising diamond particles 5. For this purpose, the connection between the central feed of the device 4 and the reservoir of diamond particles is disabled and the feed is connected to a reservoir of copper particles 6 so that a layer 6a of copper particles 6 is formed on the diamond layer 5a, cf. FIG. 1c.

In a subsequent step, a laser beam 7, which is generated, for example, by a laser (not shown), is irradiated on the layers 5a, 6a arranged one on top of the other, a fusion zone being formed in the area where the laser beam 7 hits. The laser beam 7 is moved here in a scanning manner over the surface of the layers 5a, 6a, as a result of which the latter fuse with one another to form a diamond-copper composite material 8 which also bonds to the substrate 3, cf. FIG. 1d. The diamond-copper composite material 8 has a copper matrix 9 here in which the diamond particles 5 are embedded. In order to enable the laser beam 7 to scan, a processing head (not shown) is moved under the openings in the XY plane. The wavelength of the laser beam can be adjusted to the selected material here, wavelengths between approx. 0.3 µm and 2 µm usually being used. For metal particles of copper or aluminium, for example, a wavelength in the visible wavelength range (between approx. 380 nm and 780 nm), in particular in the green wavelength range (between approx. 490 nm and 575 nm), are selected, whereas, for silver, for example, a wavelength in the UV range (below 380 nm) may be selected. The laser power may be in the range of approx. 1 watt to 1000 watts in order to allow laser sintering or selective laser melting.

The volume ratio of the diamond particles 5 to the copper matrix 9 of the diamond-copper composite material 8 may be adjusted by appropriately selecting the ratio d1/d2 of the thicknesses d1, d2 of the layers 5a, 6a. In order to start out with the smoothest possible surface for producing the layer of the diamond-copper composite material 8, contrary to the representation shown in FIG. 1a-d, it is possible first of all to apply one or more layers 6a of metal particles 6 to the substrate 3 and fuse these layers with the latter using laser radiation 7.

Figure 1D:
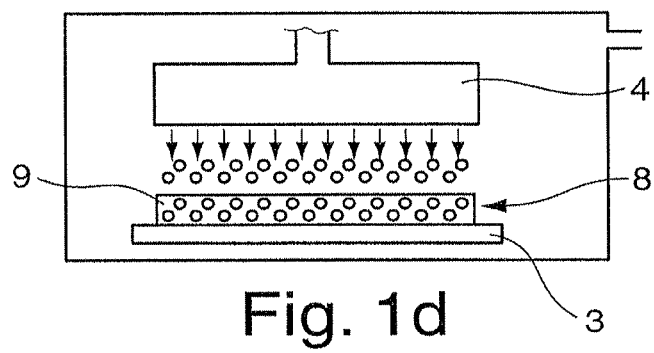

In order to obtain a shaped body of the diamond-copper composite material 8, the process described in connection with FIGS. 1a-d can be repeated a number of times until the desired volume of the shaped body is achieved, as indicated in FIG. 1d, in which, in a subsequent step, further diamond particles 6 are applied to the diamond-copper composite material 8. If applicable, a structuring or an adaptation of the geometry or expansion of the layers in the XY direction to a desired geometry can be carried out by targeted, controlled closure of the openings in the device 4 for distributing the particles 5, 6.

Figure 2A:
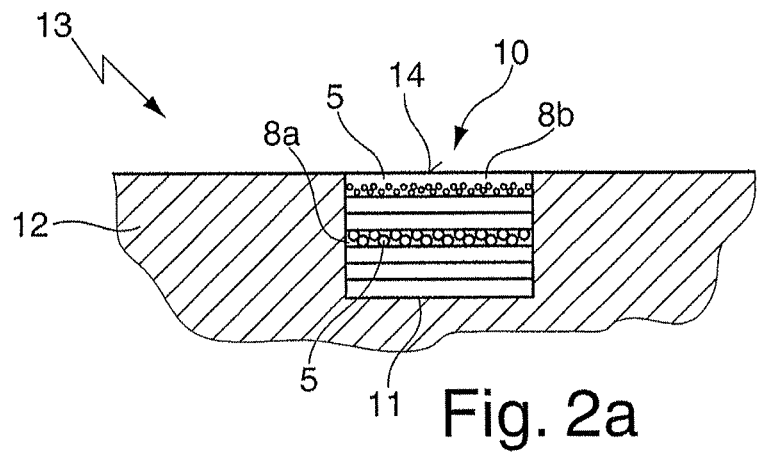

A shaped body 10 comprising the diamond-copper composite material 8 having an essentially cuboid geometry is shown in FIG. 2a. The shaped body 10 is introduced in a receptacle 11 of a base body 12 of copper which is part of a heat sink 13. The shaped body 10 can (if applicable with the substrate) be introduced into the receptacle 11 as a prefabricated body. Alternatively, it is also possible for the shaped body 10 to be formed in situ in the receptacle 11 which serves as a mould in which the layers 5, 6 are applied on top of one another.

As can likewise be seen in FIG. 2a, the cuboid shaped body 10 has a plurality of layers 8a, 8b of the diamond-copper composite material 8. A final layer 8b on the upper side 14 of the shaped body 10 in the post-processing area has no diamond particles 5 here, i.e. through appropriate selection of the volume ratio of metal particles to diamond particles, the fusion forms, after infiltration, a sufficiently large layer thickness above the diamond particles in which practically no more diamond particles are present. It can thereby be assured that contact with a component in the form of a high-performance laser diode 15 (cf. FIG. 2b) applied directly on the upper surface 14 of the shaped body 10 serving as a positioning surface can be produced over the whole surface in order to guarantee effective thermal transfer. The direct connection of the component to the shaped body 10 can be made, for example, by bonding. It is also possible, as an alternative, for the component to be affixed to the shaped body 10 by a joining method using a joining agent, e.g. by soldering or adhesion.

Figure 2B:
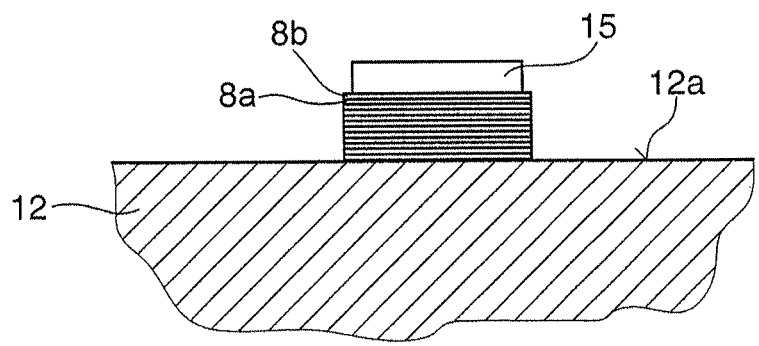

In the example shown in FIG. 2b, the shaped body 10 is soldered onto the upper surface 12a of the cuboid base body 12. A layer of metal particles is applied here, as a final layer 8b, onto a layer 8a of the carbon-metal composite material. The final layer 8b has been irradiated with a laser during production in order to fuse the metal particles and join them to the layer 8a of the carbon-metal composite material lying underneath it. The final layer 8b is therefore, in this example, practically free of carbon particles and is particularly suitable for post-processing to achieve the lowest possible surface roughness.

It is self-evident that the thicknesses of the layers 8a, 8b of the diamond-copper composite material 8 can be selected differently in the thickness direction (Z), contrary to what is shown in FIGS. 2a,b. If applicable, the metallic particles and/or the carbon particles used can also be varied from layer to layer. For example, a layer of diamond-silver composite material can follow a layer of diamond-copper composite material or vice versa.

Figure 3:
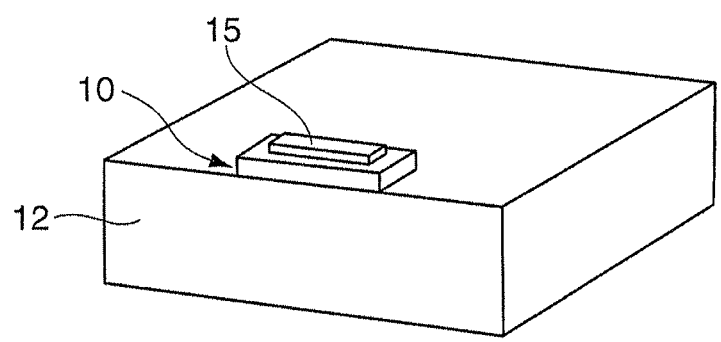
FIG. 3 shows a schematic, perspective representation.

As can be seen in FIG. 3, the shaped body 10 and the laser diode 15 are formed on the edge of the base body 12 of the heat sink 13 of FIG. 2b and serve to emit laser radiation in a direction that is pointing away from the heat sink 13. The application of the laser diode 15, which essentially consists of GaAs, onto the shaped body 10 of the diamond-copper composite material 8 is also particularly advantageous, inter alia, because both have comparable thermal expansion coefficients. It is self-evident that, instead of laser diodes, other components can also be cooled with the aid of the heat sink 13, for example laser discs as used, for example, in a solid state laser. Since, in this case, the laser radiation is typically emitted in a direction perpendicular to the flat sides of the plate-shaped laser disc, the laser disc is not usually arranged on the edge of the heat sink but instead centrally on the heat sink.

It is likewise self-evident that the method shown in FIGS. 1a-d, in particular the fusion of the layers 5a, 6a, may, if applicable, be supported by a pressure p that is above atmospheric pressure or by a temperature T that is above room temperature. The method described here, owing to the layered structure of the shaped body 10, allows flexible adjustment of its properties in terms of geometry, surface quality, material behaviour, etc. The equipment used for producing the carbon-metal composite material is not complex and is therefore inexpensive to purchase.

What is claimed is:

1. A method of making a heat sink comprising a composite material, the method comprising:
    applying at least one layer comprising carbon particles and at least one layer comprising metal particles on top of one another;
    fusing of the layers by irridating the layers with laser radiation to form a carbon-metal composite material; and
    forming a shaped body from the carbon-metal composite material by repeating the applying and the fusing of layers multiple times;
    wherein, in order to form a final layer for the shaped body, only metal particles are applied.

2. Method according to claim 1, in which at least two of the layers have carbon particles with different granulation.

3. Method according to claim 1, in which at least two layers of the carbon-metal composite material are produced having different volume ratio of carbon particles to a metal matrix formed from metal particles.

4. Method according to claim 1, in which the metal particles are selected from the group comprising: copper, silver, gold, aluminum, tin and titanium.

5. Method according to claim 1, in which the carbon particles are selected from the group comprising: diamond, graphite and carbide.

6. Method of claim 1, further comprising the following steps:
    applying at least one layer of metal particles to a substrate; and
    fusing of the layer to the substrate through laser radiation.

7. Method according to claim 1, in which at least one layer comprising carbon particles is applied with a density varying in a thickness direction.

8. The method of claim 1, further comprising directly connecting a component to the final layer by bonding the component to the final layer.

* * * * *

UNITED STATES PATENT AND TRADEMARK OFFICE
CERTIFICATE OF CORRECTION

PATENT NO. : 9,995,541 B2
APPLICATION NO. : 14/233488
DATED : June 12, 2018
INVENTOR(S) : Klaus Wallmeroth and Christian Schmitz Page 1 of 1

It is certified that error appears in the above-identified patent and that said Letters Patent is hereby corrected as shown below:

On the Title Page

Column 1, (73) Assignee, under "Schramberg (DE)", insert:
--TRUMPF LASER- UND SYSTEMTECHNIK GMBH Schramberg (DE)--

Signed and Sealed this
Fourth Day of September, 2018

Andrei Iancu
*Director of the United States Patent and Trademark Office*